United States Patent [19]
Fernandes et al.

[11] Patent Number: 5,857,091
[45] Date of Patent: *Jan. 5, 1999

[54] MACHINE AND METHOD FOR SIMULATING A PROCESSOR-BASED DIGITAL SYSTEM

[75] Inventors: Neufito L. Fernandes, Cupertino; Kenneth J. Duda, Menlo Park; Alfred Platt, Cupertino, all of Calif.

[73] Assignee: Siemens Business Communication Systems, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 403,597

[22] Filed: Mar. 14, 1995

[51] Int. Cl.$^6$ ..................................................... G06G 7/48
[52] U.S. Cl. ............................................ 395/500; 364/578
[58] Field of Search ..................................... 395/500, 550, 395/800, 600, 750, 183.09, 183.04, 159, 183.06, 133, 155, 884, 183.22, 183.14, 800.23, 800.43, 821, 827, 704, 802; 364/578, 488, 802, 137

[56] References Cited

U.S. PATENT DOCUMENTS

| | | | |
|---|---|---|---|
| 4,918,594 | 4/1990 | Onizuka | 364/578 |
| 5,081,601 | 1/1992 | Eirikasson | 364/578 |
| 5,363,501 | 11/1994 | Pullela | 395/500 |
| 5,404,496 | 4/1995 | Burroughs et al. | 395/500 |
| 5,493,672 | 2/1996 | Lau et al. | 364/578 |
| 5,530,804 | 6/1996 | Edgington et al. | 395/500 |
| 5,546,562 | 8/1996 | Patel | 364/578 |
| 5,557,774 | 9/1996 | Shimabukuro et al. | 364/578 |

FOREIGN PATENT DOCUMENTS

A 0 418 980
A3   3/1991   WIPO .............................. G06F 15/60

OTHER PUBLICATIONS

Hisashi Kobayashi "Modeling and Analysis An Introduction to System Performance Evaluation Methodology" pp. 228–230 and pp. 317–320, published by Addison–Wesley Publishing Company. No date.

Thomas et al., "A Model and Methodology For Hardware–Software Codesign," *IEEE Design & Test Of Computers*, vol. 10, No. 3, pp. 6–15, Sep. 1993.

Morris et al., "Linking Software and Hardware Design," *High Performance Systems*, vol. 11, No. 6, pp. 29–40, Jun. 1990.

Becker et al., "An Engineering Environment For Hardware/Software Co–Simulation," *29th ACM/IEEE Design Automation Conference*, pp. 129–134, 8 Jun., 1992.

Kenneth J. Duda, "Extending a Generic Hardware Simulator with a Multithreaded Programming Language for Embedded System Software Debugging", Master Thesis submitted to the Massachusetts Institute of Technology Department of Electrical Engineering and Computer Science on May 18, 1993.

*Primary Examiner*—Jacques H. Louis-Jacques

[57] ABSTRACT

A machine and method for allowing a simulated processor environment to interact with a simulated digital environment to simulate a processor-based system. Embodiments of the present invention contemplate that interaction between the processor environment and digital environment can be implemented by providing the processor environment with a list of "significant events" (e.g., reads and writes) that are pertinent to the digital environment. Embodiments of the present invention also contemplate that the processor environment and digital environment can be synchronized by allowing operations to occur on either the processor environment or the digital environment, but not on both simultaneously.

20 Claims, 5 Drawing Sheets

5,857,091

MACHINE AND METHOD FOR SIMULATING A PROCESSOR-BASED DIGITAL SYSTEM

BACKGROUND OF THE INVENTION

1. Field of the Invention

The present invention relates to a machine and method for simulating a processor-based digital system by interconnecting a processor simulator with a digital model of hardware. More specifically, the present invention relates to a machine and method for testing a system in a simulated environment, wherein the system being simulated is envisioned to contain a processor and digital hardware. Within the simulation environment, the processor simulator and digital model communicate with each other such that true interaction between a real processor and digital hardware is simulated. In this way, enhanced testing of the system and, in particular, the digital hardware, can be conducted prior to fabrication of the actual component.

2. Related Information

In today's high-tech environment, an increasing number of devices utilize computer processors. This includes cars, telephone systems and home appliances. In addition, the number of general purpose computers using such processors is also on the rise. In all these systems, software controls the action of the processor, and the processor then typically controls (and reacts to) the digital hardware within the system. For example, in a telephone system, the processor might write certain data to a specified address of memory (corresponding to a portion of the digital hardware) which causes a certain telephone to ring. Of course, these systems can be capable of millions of different possible types and combinations of operations that can be executed in a relatively short time span.

When developing such complex systems having one or more processors and associated digital hardware, testing is a very important and time-consuming process. In conventional development schemes, the processor is an "off-the-shelf" item that can be purchased from a number of different vendors. The software for the processor is then typically written for the specific purpose contemplated, or else it is purchased and then often modified. The digital hardware is usually custom built for the intended purpose, and then tested independently of the software used to run the processor. Once the hardware testing is complete, the hardware is fabricated, assembled and interfaced with the processor and its associated software.

Testing the processor and fabricated digital hardware together almost always results in more reworking of both the hardware and software, since flaws not detected during the separate testing stage tend to surface at that point. Although reworking the software of the processor can also be a considerable effort, refabrication of the hardware is particularly expensive and time-consuming, especially when dealing with ASIC technology. If a single refabrication can be avoided, the savings to the company is impressive, in both time and money. In addition, in conventional development schemes as described above, the software developers often find themselves waiting until the hardware is re-fabricated so that testing can begin again.

The advent of computer technology generally has enhanced the hardware engineer's ability to test digital hardware by itself. For example, computer-based products allow the engineer to construct digital models to test his or her theories before the hardware is actually fabricated. Typically, to get an accurate assessment of the hardware, virtually each signal of the hardware being tested will be simulated. Unfortunately, the testing that can be done using the digital simulator is still not nearly as thorough as having a processor attached to the fabricated digital hardware. This is because the processor is able to more faithfully and more realistically run the digital hardware through the various possible situations and permutations that can occur in the system and do so in an interactive manner.

The software can, to some degree, also be tested by itself using such devices as processor simulators. However, when a software instruction is encountered that would otherwise send or receive information to or from the digital hardware, the simulation will not be able to accurately reflect the way the real system would react.

A partial solution was discussed in the Massachusetts Institute of Technology graduate thesis by Kenneth J. Duda, published May, 1993, entitled "Extending a Generic Hardware Simulator with a Multi-threaded Programming Language for Embedded System Software Debugging," which is incorporated by reference herein. This partial solution envisioned a process simulator communicating with a process that, in some ways, acted as a digital model. However, what was envisioned was for testing the software portion only, and was totally inadequate to test hypothetical hardware. Thus, testing the software-hardware system also was not possible using this concept.

Consequently, what is needed is a way to allow the processor-digital hardware combination to be more accurately tested prior to fabrication of the digital hardware.

SUMMARY OF THE INVENTION

The present invention addresses the problems described above by providing a machine and method for allowing a simulated processor environment to interact with a simulated digital environment to simulate a processor-based system. In doing this, the system can be tested more thoroughly before fabrication of hardware than was possible by testing the individual components separately.

Embodiments of the present invention contemplate that interaction between the processor environment and digital environment can be implemented by providing the processor environment with a list of "significant events" that are pertinent to the digital environment. These significant events might be, for example, reads from or writes to memory addresses corresponding to addresses of the specific digital model being tested. That way, when a significant event is identified by the processor environment in the course of executing software instructions, it can respond by sending appropriate information to the digital environment. Embodiments of the present invention contemplate that a custom-built processor environment can be prepared for this purpose, or that an available processor environment can be modified.

Embodiments of the present invention also contemplate that the processor environment and digital environment can be synchronized by allowing operations to occur on either the processor environment or the digital environment, but not on both simultaneously. Thus, the processor environment is envisioned to begin processing software instructions. When a significant event is detected, appropriate information is sent to the digital environment, and the processor environment suspends executing further instructions. The digital environment is then "woken up," permitted to "catch-up" in time with the processor environment, and then the information pertaining to the significant event is processed. Any resultant information and/or an acknowledgement is subsequently sent back to the processor environment, causing the processor environment to resume its operation and the digital environment to suspend its operation.

Of course, it should be understood that the present invention also envisions other configurations and combinations beyond what has been specifically described herein.

BRIEF DESCRIPTION OF THE DRAWINGS

Various objects, features, and attendant advantages of the present invention can be more fully appreciated as the same become better understood with reference to the following detailed description of the present invention when considered in connection with the accompanying drawings, in which.

DETAILED DESCRIPTION

The present invention relates to a machine and method for simulating a processor-based digital system by interconnecting a processor simulator with a digital model of hardware. More specifically, the present invention relates to a machine and method for testing a system in a simulated environment, wherein the system being simulated is envisioned to contain a processor and digital hardware. Within the simulation environment, the processor simulator and digital model communicate with each other such that true interaction between a real processor and digital hardware is simulated. In this way, enhanced testing of the system and, in particular, the digital hardware, can be conducted prior to fabrication of the actual component.

The way that the present invention accomplishes this is by linking an emulated processor environment with an emulated digital environment. The present invention envisions that this can be implemented either by custom-development of one or both environments, or purchasing an available version of one or both environments as will be discussed below. In any event, realization of the present invention required overcoming some difficult hurdles. For example, the world of processor simulators comprises memory, registers and instructions (i.e., in an instruction-oriented format) whereas the world of digital simulators comprises simulated wires carrying digital signals (i.e., in a bus signal format). The two worlds need to be made to communicate with each other. Also, synchronizing an emulated processor environment with an emulated digital environment is difficult, since the processor portion runs much, much faster than the digital portion relative to the amount of time it would take a real processor to run relative to real digital hardware. That is, the processor portion runs much closer to the speed of a real processor than the digital portion runs in comparison to the real digital hardware being emulated, and thus it takes the processor portion much less time to run through one second of real-life (i.e., "non-simulated") activity than it does for the digital portion. In addition, an emulated processor environment needs to be made aware of the events that are important to the emulated digital environment.

Figure 1:
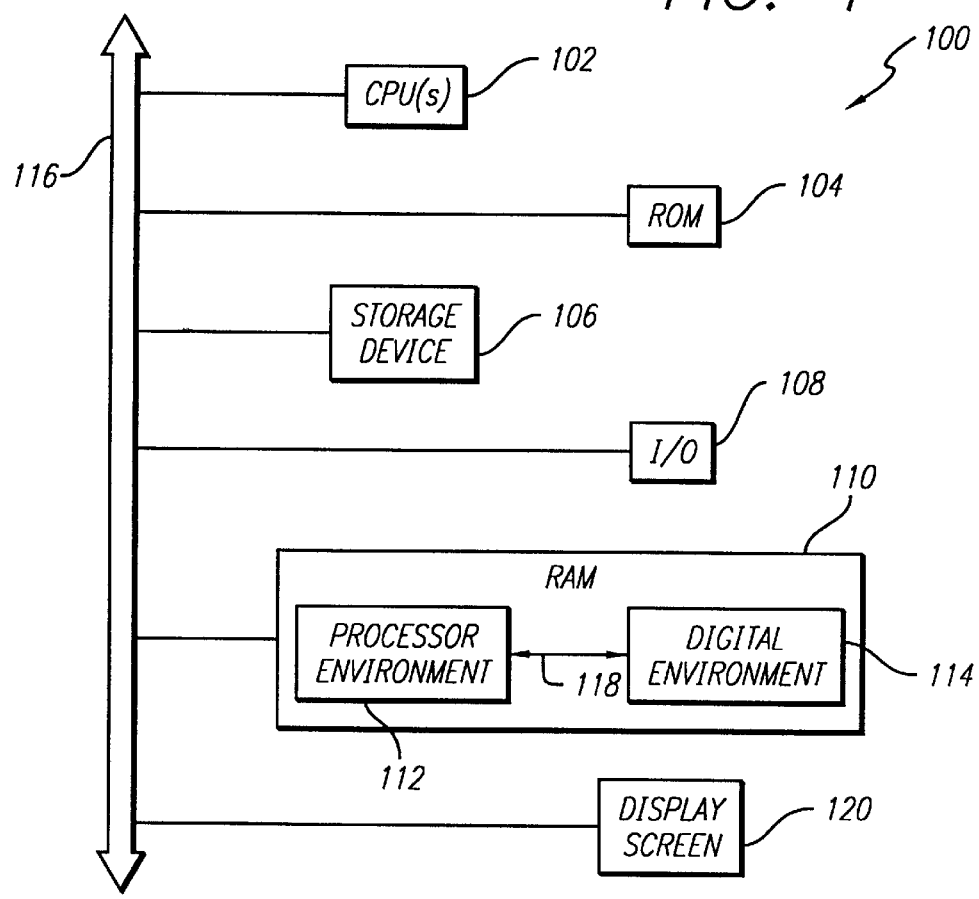
FIG. 1 is a high-level diagram of the present invention and environments thereof as contemplated by embodiments of the present invention.

Embodiments contemplated by the present invention and environments thereof can best be described with regard to FIG. 1. Referring now to FIG. 1, this figure represents a computer environment such as those from either single or multiple-user computers having one or more processors. In addition, the computer environment can pertain to microcomputers/workstations, minicomputers, mainframes and massively parallel processing computers. Examples of microcomputers/workstations include the IBM PC manufactured from IBM Corporation of Armonk, N.Y., and the Sparc-Station from Sun Microsystems of Mountain View, Calif.; Examples of minicomputers are the VAX 750 from Digital Equipment Corporation of Maynard, Mass. and the AS/400 from IBM; an example of a mainframe is the System-390 series from IBM; and an example of a massively parallel processing computer is the Cray T3D from Cray Research of Eagan, Minn. Of course, any number of other types of computer systems are also contemplated for use with the present invention. Also, the present invention contemplates that two or more of such computer environments can be linked and used together.

In addition, any number of operating systems can be used with regard to the computer environment used with the present invention, including any of the various versions of Unix, VMS from Digital Equipment or OS/2 from IBM. Although any number of operating systems can be used, it is particularly advantageous to choose an operating system having good inter-process communication facilities.

Referring now to the components of a computer 100 shown in FIG. 1, a bus 116 is shown connecting the various components. Specifically, shown attached to the bus is one or more CPUs 102. Embodiments of the present invention contemplate that the CPUs 102 can be those typically found in the computers mentioned above, or they can be any number of other types of CPUs. For example with regard to microcomputers, any of the Intel 80X86 series, Pentium or any other CPU developed in Intel's future line of CPUs is contemplated.

A RAM 110 can encompass various items, including portions of the present invention (as shown) as contemplated by various embodiments. One item shown includes a processor environment 112, which is envisioned to emulate a computer processor environment. Also shown in RAM 110 is an digital environment 114, which is envisioned to emulate one or more pieces of digital hardware.

As can be seen by a link 118, the two environments 112 and 114 are in communication with each other. For example, an assembly language program might be executing in the processor environment 112 when an instruction in the program indicates that data should be read from a certain memory address corresponding to a portion of simulated hardware in the digital environment 114. When that occurs, embodiments of the present invention contemplate that a request to read the data from the specified address is sent over link 118. Subsequently, the requested data from the specified address is sent from digital environment 114 through link 118 to processor environment 112. This will be explained in greater detail below.

RAM 110 can be any type of memory device, including DRAMS and SRAMS. As will be elaborated on below, processor environment 112 and digital environment 114 can, in whole or part, also be placed onto other types of storage devices.

A ROM 104, as contemplated by embodiments of the present invention, can be used to store any number of different types of information required by the computer 100. For example, information concerning initialization routines or even some or all of processor environment 112 and digital environment 114 that, for the most part, will not be changed over the course of testing and simulating various components, can be stored in ROM 104. Embodiments of the present invention contemplate that ROM 104 can be any number of different types of devices, including PROMS, EPROMS and EEPROMs.

Storage device 106 is contemplated to be any type of mass storage device, including magnetic, electrical, optical and biological-types of storage. Again, various embodiments of the present invention contemplate that all or some of processor environment 112 and digital environment 114 can be encompassed by storage device 106.

I/O device 108, as contemplated by embodiments of the present invention, can be keyboards, printers, or any other type of device by which information can be entered into or received from computer system 100. In this way, additional information can be sent to or received from environments 112 and 114.

Display screen 120 is contemplated to be used to display the interaction between environments 112 and 114 and/or the final results of a simulation. The display screen 120 can be any number of displays having various resolutions, including those of the CRT and flat-panel display type.

Figure 2:
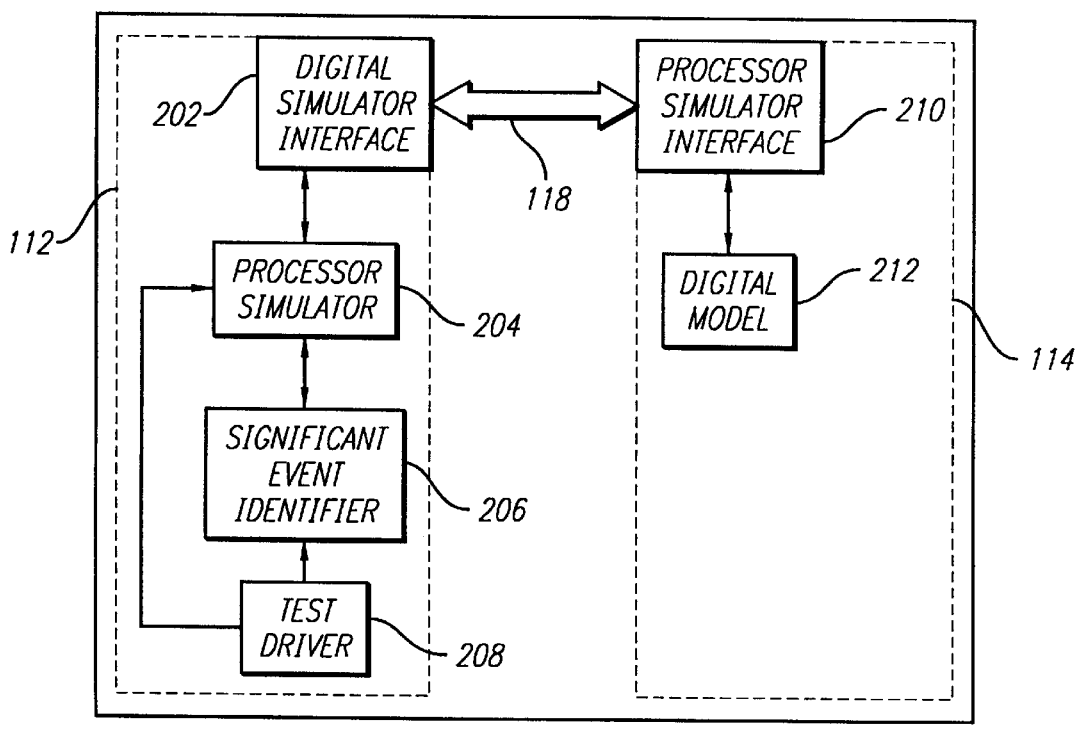
FIG. 2 is a block diagram of the processor and digital environments as contemplated by embodiments of the present invention.

Various embodiments of environments 112 and 114 are now described with regard to FIG. 2. Referring to FIG. 2, the embodiments of processor environment 112 depicted can be seen to include a number of components. In particular, a processor simulator 204 is shown. Embodiments of the present invention contemplate that this processor simulator can be an available processor simulator or one that is custom-built. In addition, any number of different processors can be simulated. Examples include GNU simulators simulating the Zylog 8000 or Hitachi SH processors. Such simulators can be obtained by contacting the Free Software Foundation, Inc., 675 Massachusetts Avenue, Cambridge, Mass. Of course, one would typically want to use a simulator corresponding to the processor contemplated for use in the real, envisioned system that is being simulated.

A significant event identifier 206 provides the processor simulator 204 with the events that are relevant to the digital environment 114. Such events include reads and writes to memory locations that exist on (and are relevant to) the digital environment 114.

Various embodiments contemplated by the present invention envision that significant event identifier 206 can be separate from the processor simulator 204 or can actually be a part of it. Various embodiments of the present invention contemplate that the processor simulator 204 be modified to recognize such events. The processor simulators mentioned above are examples of such simulators that are envisioned to be so modified. Specifically, such simulators might have been written using the C programming language, and are assumed to be structured as follows:

```
typedef unsigned long Address;
typedef unsigned long Word;
char simulated_ram[1048576];  /* one megabyte of RAM */
Word sim_read_word (Address address)
{
    Word word = *((Word *) (&simulated_ram[address]));
    return word;
}
void sim_write_word (Address address, Word word)
{
    *((Word *) (&simulated_ram[address])) = word;
}
```

To allow such simulators to recognize significant events and to interact with digital environment 114, various embodiments contemplate that the following example modification can be made:

```
typedef unsigned long Address;
typedef unsigned long Word;
char simulated_ram[1048576];  /* one megabyte of RAM */
Word sim_read_word (Address address)
{
    if (address_is_significant(address)) {
        return read_significant_address(address);
    } else {
        Word word = *((Word *) (&simulated_ram[address]));
        return word;
    }
}
void sim_write_word (Address address, Word word)
{
    if (address_is_significant(address)) {
        write_significant_address(address, word);
    } else {
        *((Word *) (&simulated_ram[address])) = word;
    }
}
```

In the example mentioned above, various embodiments envision that the subroutines read_significant_address() and write_significant_address() are part of a digital simulator interface 202 (described below) and address_is_significant() is part of significant event identifier 206.

In any event, in the subroutine "address_is_significant," a listing of all those addresses that are considered significant would be placed. Thus, if that subroutine returns true, the address is significant to digital environment 114. Such a subroutine could be replaced and updated depending upon the specific digital hardware being simulated. Embodiments of the present invention contemplate that the event identifier 206 is accessed by the processor simulator 204 as part of an initialization procedure so that the processor simulator 204 will know up front what events are to be considered significant.

A test driver 208 is contemplated to provide the processor simulator 204 with software instructions to be executed. Also contemplated by embodiments of the present invention, test driver 208 provides a list of significant events to be used by the significant event identifier 206. Some embodiments also contemplate that significant event identifier 206 and test driver 208 can be one and the same. Lastly, some embodiments of the present invention also contemplate that test driver 208 can be used to provide certain stimuli to digital environment 114 as well.

Some embodiments of the present invention contemplate that the processor environment 112 is programmable. It could be programmable through a specialized or well known programming language, and it can be interpreted or compiled. Moreover, when the processor environment 112 starts, a program is read from, e.g., storage device 106 that specifies that, e.g., the significant event identifier 206 is to be used as the source of the significant events. In this way, the processor environment 112 is kept independent of the specific digital model being tested. Thus, processor environment 112 can be used to test many different digital models.

When, during the course of executing software instructions on processor simulator 204 a significant event is detected, the processor simulator 204 forwards the event to digital simulator interface 202. Thus, for example, if a request is detected to write data to an address that would exist on the digital hardware, then the pertinent address, the data to be written and a write "command" is sent to the digital simulator interface 202 as "event information" (although some embodiments envision that a command is not necessary, since the existence of data indicates that a "write" is to take place). The digital simulator interface 202 proceeds to put this event information into a format that can be sent to and understood by digital environment 114. This event information is then sent to digital environment 114 via link 118. Various embodiments envision that a "time stamp" is also sent with the event information via link 118, as will be explained below.

When event information is sent to digital environment 114 over the link 118, it is received by a processor simulator interface 210 which interprets the data and puts it into a format understandable by the rest of digital environment 114. The event information is then sent to a digital model 212 for processing. As mentioned above, the digital model serves as a simulation of the digital hardware (e.g., a memory device) that an engineer is contemplating fabricating. The present invention contemplates that the hardware being simulated can be any number of different devices which, can themselves, be interconnected with any number of other devices, simulated or otherwise.

As an example of the concept just described, if a significant event such as a "write" to an address pertaining to digital model 212 is encountered, the data forwarded through link 118 is written to the address specified. Embodiments of the present invention then contemplate that an acknowledgement that the write operation has occurred is sent back to the processor environment 112 via link 118. Also, various embodiments of the present invention contemplate that any subsequent effects of the write (e.g., that it causes the digital model 212 to retrieve data from another source (not shown)) can also be sent to the processor environment 112.

In order for the simulation of the overall system to work properly, the processor environment 112 must be synchronized with the digital environment 114. This means that the two environments 112 and 114 must have the same sense of time (i.e., one simulated second must mean the same thing to both environments). This problem becomes even more cumbersome because, as indicated above, processor simulators run much, much faster than digital hardware simulators relative to their real-life counterparts.

One way to address the synchronization issue as contemplated by embodiments of the present invention is as follows. Event information is sent from processor simulator 204 to digital simulator interface 202. Digital simulator interface 202 is envisioned to comprise one or more routines that prepare and ship the event information through link 118. Various embodiments of the present invention contemplate that link 118 is a named pipe in a UNIX environment. Of course, it should be understood that various other linking methods are contemplated as well. In any event, when the event information is forwarded to the processor simulator interface 210 through 118, all activity (i.e., time) on processor environment 112 is frozen. Embodiments of the present invention contemplate that this can be done by issuing a READ system call on the "incoming" end of the named pipe. The UNIX kernel will block further processing until something is received.

Various embodiments of the present invention also contemplate that activity on the digital environment 114 is also frozen until it receives event information through link 118. As mentioned above, embodiments of the present invention also contemplate that a time stamp is sent by the processor environment 112. This is envisioned as an indication of the amount of time that has passed since processor environment 112 last sent any event information (or, possibly, other commands as will be discussed below) to digital environment 114.

Upon receiving this time stamp, digital environment 114 executes the appropriate number of clock cycles corresponding to the amount of time that has passed since the last event information (or, possibly, some other command) was received. Then, the actual significant event that was received is processed. Thus, for example, if the processor simulator interface 210 receives event information to read data from a specified address and is informed that 500 nanoseconds have elapsed since event information was last received, digital environment 114 will cycle through 500 nanoseconds worth of clock cycles before issuing the read command.

After the event information has been processed by digital environment 114, an acknowledgement is sent through link 118 back to digital simulator interface 202. Various embodiments of the present invention contemplate that the results of, e.g., a read, can act as such an acknowledgement. In any event, the sending of an acknowledgement causes emulating digital environment 114 to, again, become inactive and wait for more event information (or command). Receipt of the acknowledgement by processor environment 112 takes it out of its time-frozen state.

An advantage of using inter-process communications systems such as UNIX named pipes as link 118 is that environments 112 and 114 can each be treated as a process that can be resumed when event (or acknowledgement) information is received from the pipe. The time stamp can than be used as the mechanism that indicates when the digital environment 114 should, again, freeze time. However, it should be understood that various embodiments of the present invention do also envision mechanisms for synchronizing environments 112 and 114 so that they both continue to run simultaneously. In such a scenario, the relative time of each environment would be maintained in synch with the other. In addition, the present invention also contemplates that any number of different types of links that can be used for link 118. This includes local area network protocols such as TCP, where environments 112 and 114 (or portions thereof or multiple processor simulators and/or digital models) are each on a different computer system 100.

In addition to sending event information such as read or write events to the digital environment 114, embodiments of the present invention also contemplate that processor environment 112 is also capable of sending a variety of other types of information across link 118. For example, in order to make sure that the processor environment 112 does not get too far ahead of the time-frozen digital environment 114, embodiments of the present invention contemplate that a "cycle" command can be sent to the digital environment 114. Such as command causes that environment to run a set number of clock cycles so that digital environment 114 catches up, in time, with processor environment 112. In this way, events emanating from the digital environment 114 that might be of interest to the processor environment 112 (e.g., interrupts) can be processed in way that closely resembles the situation in a real-life processor-hardware environment.

Another command that can be sent to the digital environment 114 as contemplated by various embodiments of the present invention is the "poll" command. This allows the state of a specified simulated signal of the digital model 212 to be obtained. In various embodiments using this command, it is envisioned that the test driver 208 sends such a command directly to the digital simulator interface 202 (and then across link 118), thus bypassing the processor simulator 204. In addition, the result obtained from the poll command also is envisioned to bypass the processor simulator 204 and be received by the test driver 208 from the digital simulator interface 202. After receiving this result, the test driver 208 may then take some appropriate action depending upon the result received. Of course, various embodiments of the present invention do contemplate other configurations where, for example, the processor simulator 204 does participate in this process.

Since various embodiments of the present invention contemplate that processor environment 112 runs much closer to the speed of a real processor than the digital environment 114 runs in comparison to the real digital hardware being emulated, embodiments of the present invention contemplate that, in certain situations, the amount of time indicated by the time stamp can be artificially significantly lessened. Thus, for example, if 100,000 nanoseconds have elapsed since the last event information was sent to the digital environment 114, it may only be necessary to indicate that the digital environment 114 needs to catch up by 10,000 nanoseconds. In many situations, this will work satisfactorily. However, in situations where, for example, an interrupt is likely to occur between the 10,001 and 100,000 nanosecond point, such an embodiment would not be appropriate.

As can be appreciated from the discussion above, embodiments of the present invention contemplate that the processor environment 112 acts as the "master," triggering the execution of digital environment 114 by way of sending event information. Of course, various embodiments of the present invention contemplate that the opposite relationship could be implemented, or that the two can act as peers.

It should be understood that the implementations and examples given above concerning the components and their interactions with one another comprise possible schemes envisioned by the present invention, but that any number of different configurations are also envisioned.

Figure 3:
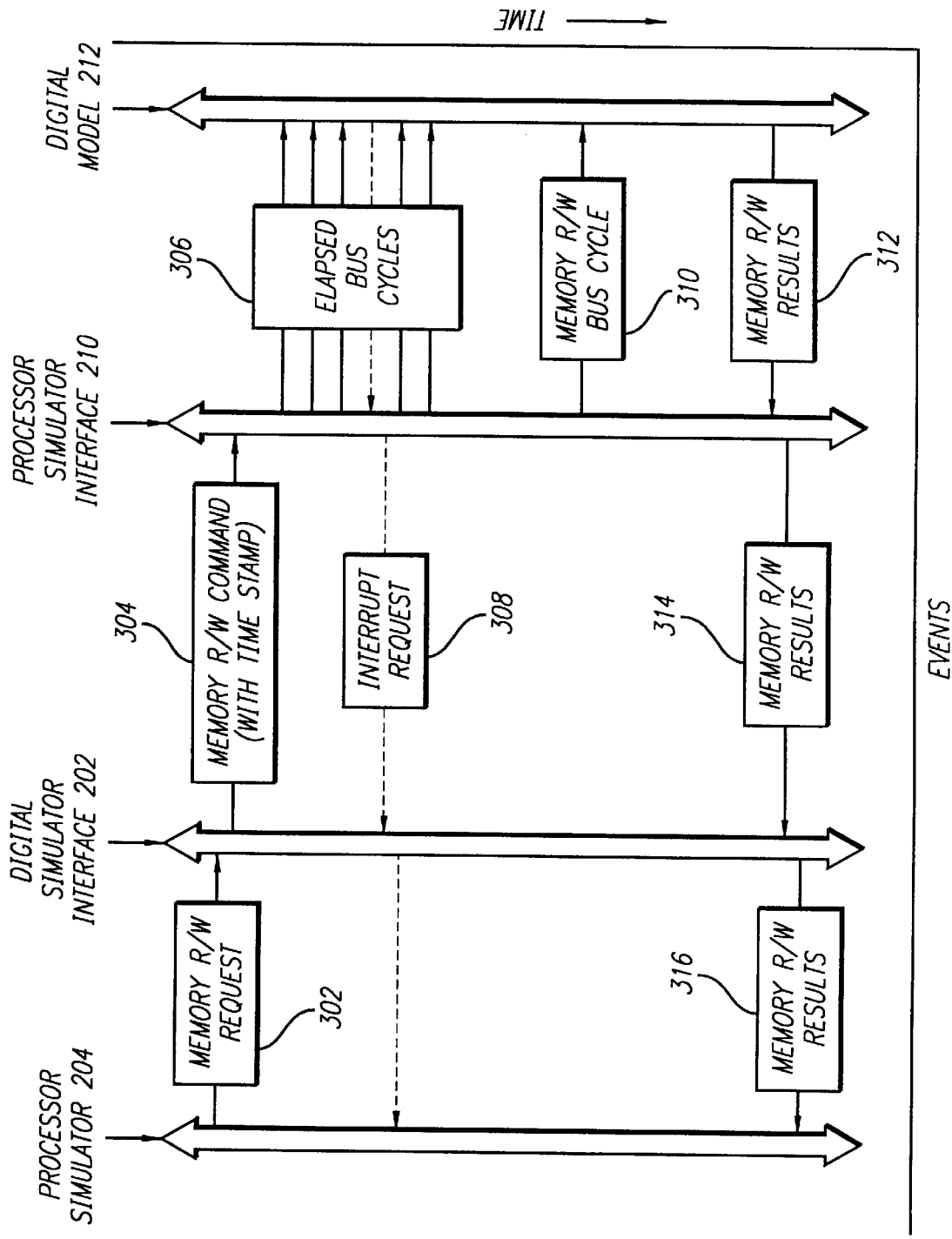
FIG. 3 is a timing diagram indicating the sequence of various actions contemplated in various embodiments of the present invention.

A diagram showing the timing between various components as contemplated by various embodiments of the present invention is shown at FIG. 3. In particular, the significant events that are discussed in this Figure concern memory reads or memory writes. Referring now to FIG. 3, it can be seen that the sequence of events moves, in time, from the top of the Figure downward. Thus, the first event shown to occur is a memory read or a memory write request received by the digital simulator interface 202 from processor simulator 204. This is indicated by a box 302. As indicated above, this request is envisioned to contain information, such as pertinent addresses and data.

Once the request is received by digital simulator interface 202, a command is sent (across link 118) to the processor simulator interface 210 along with the time stamp indicating the amount of time that has elapsed. This is indicated by a box 304. As indicated previously, embodiments of the present invention envision that this conveyance causes the processor environment 112 to suspend further execution of software instructions and cause the digital environment 114 to commence its execution.

The processor simulator interface 210 receives the time stamp, and ultimately invokes digital model 212 to execute an appropriate number of bus cycles representing the amount of simulated time that has elapsed since event information was last received. This is indicated by a box 306. During the time that the digital model 212 is "catching up," events such as interrupts might be generated by the digital model 212. If one should occur, it is further contemplated that an interrupt request is conveyed back to the digital simulator interface 202 and processor environment 112 generally (via link 118) for processing. This is indicated by a box 308. Processing of an interrupt will be discussed further below.

Once the digital environment 114 has been allowed to "catch-up" with the processor environment 112 by virtue of executing the required number of bus cycles, the memory read or write bus cycle corresponding to the initial memory read or write command is then sent to the digital model 212 as indicated by a box 310. Then, the digital model 212 causes the results of the memory read or write request to be sent to processor simulator interface 210, as indicated by a box 312. If a memory read were requested, this would comprise the data read from the specified address. In the case of a memory write, this would comprise a mere acknowledgement that the request was processed. Either way, these results are then sent to the digital simulator interface 202 as indicated by a box 314.

Upon receipt of this information from processor simulator interface 210, the processor environment 112 is reactivated, and the memory read or write results are forwarded to the processor simulator 204, as indicated by a box 316. Once this has occurred, it is envisioned that any events generated from the digital model 212 such as an interrupt request are then processed. It should be noted that this situation is similar to that which often occurs in a real processor environment, since interrupt requests are not always processed immediately. However, in simulations where it is believed that the timing for processing such an interrupt request is critical, the present invention contemplates that the "cycle" command can be implemented relatively frequently. In this way, less time would pass between the time that an interrupt request is initiated and the time that the processor simulator 204 actually acts on it.

Figure 4:
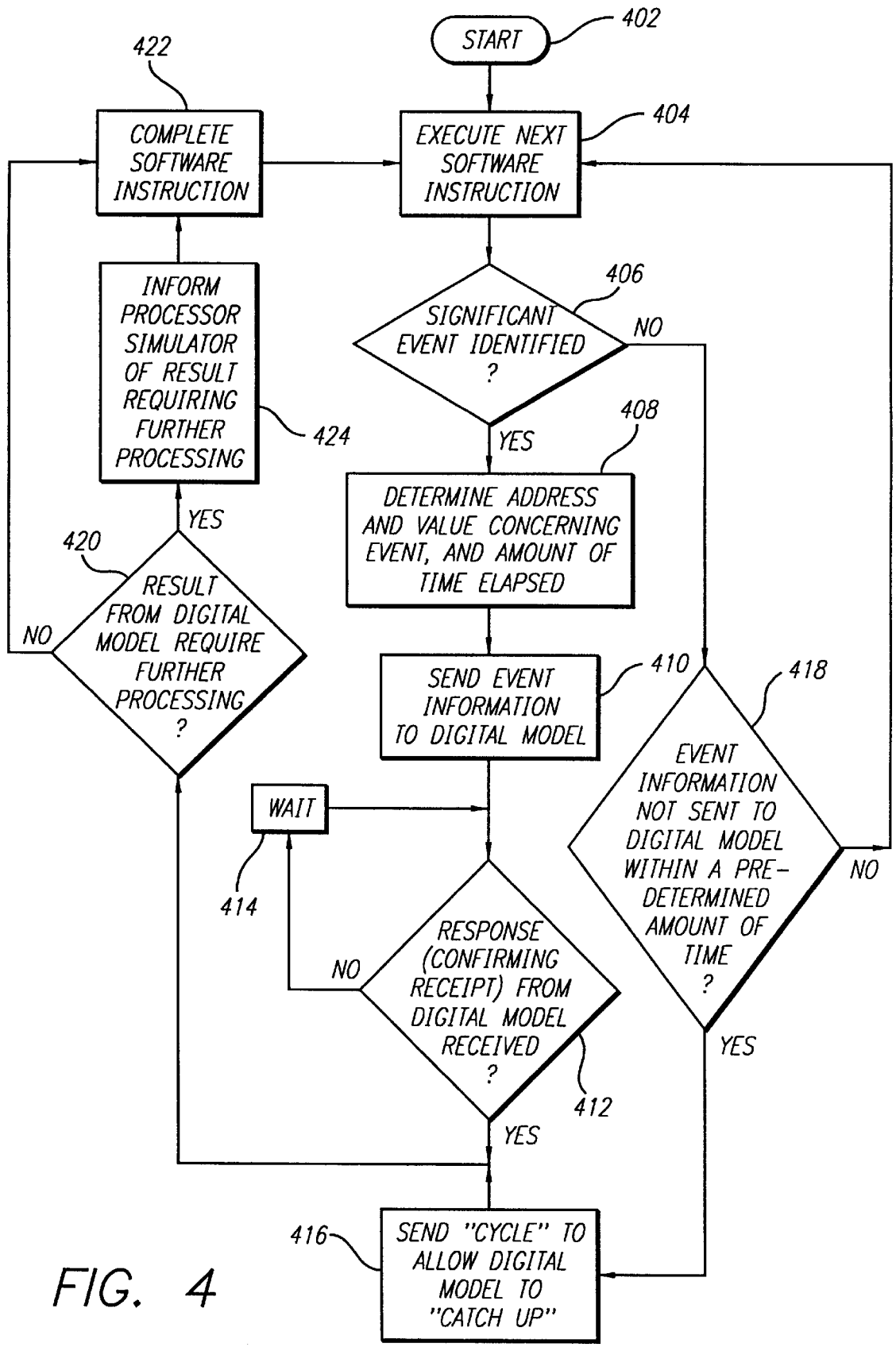
FIG. 4 is a flow diagram of a method contemplated by embodiments of the present invention concerning actions of the processor environment.

Embodiments of a method of operation of the present invention concerning the processor environment 112 and its interaction with digital environment 114 is now described using the flow chart of FIG. 4. Referring now to FIG. 4, the first step is that the processor environment 112, including processor simulator 204, is started, as indicated by a block 402. This includes initialization procedures such as identifying those events which are to be considered significant to the digital model 212 via, for example, significant event identifier 206.

Once the initialization procedures have been implemented, the next step is that the next software instruction be executed, as indicated by a block 404. Thus, as contemplated by various embodiments of the present invention, this instruction would come from a file designated by test driver 208, or from test driver 208 itself.

If in the course of executing the processor instruction a significant event is not identified, than the present invention determines whether any event information (commands, etc.) has been sent to the digital model 212 with in a predetermined amount of time. This is indicated by decision blocks 406 and 418. In other words, a determination is made whether to cause the digital model 212 to cycle for a pre-determined number of cycles to allow it to catch-up in time with the processor environment 112. If the answer is "yes," then a "cycle" command is sent to the digital model 212. Embodiments of the present invention contemplate that any number of static or dynamic mechanisms can be used to determine when a cycle command should be sent.

Since it is possible that allowing the digital model to "catch-up" as indicated by block 416 can result in the digital model 212 generating events such as interrupts, it is necessary to inquire whether the results from the cycling requires further processing, as indicated by a decision block 420. If the results from the digital model 212 do not require any further processing as a result of occurrences such as interrupts, the software instruction is then completed, as indicated by a block 422. This means that any action required to complete the instruction is executed. For example, a memory read of an address of digital model 212 may have resulted from a software instruction for obtaining that address value and placing it into a specified register of the processor simulator 204. Thus, block 422 represents executing the latter portion of the instruction, i.e., placing the obtained value into the specified register. Once done, the next sequential software instruction is executed, as indicated by block 404. Similarly, referring back to decision block 418, if there no need to send a "cycle" command to digital environment 114 then, again, control is directed to block 404.

Of course, it should be understood that any number of different types of software instructions that utilize, e.g., memory reads or writes, are envisioned by various embodiments of the present invention.

If the answer to decision block 420 is "yes," however, then the processor simulator 204 is so informed, and notes that the "result" will require further processing. This is indicated by a block 424. Before this additional processing is attended to, however, execution of the current software instruction is completed, as indicated by block 422. Then, the next software instruction is executed as per block 404 which, in the case where an interrupt had previously been detected, would likely be the instruction(s) of an interrupt event handler.

In the various situations mentioned above, if a significant event is identified as per decision block 406, then the pertinent memory address on the digital model, the value to be written to that address if the event is a "write" and the amount of time that has elapsed must be determined, as indicated by a block 408. This information is then sent to the digital model 212, as indicated by a block 410. The present invention will then wait until a response (confirming receipt) is received from the digital model 212, as indicated by decision blocks 412 and 414. In other words, time is frozen until such a response comes back. Various embodiments of the present invention contemplate that, in the case of a read or a "poll" command, the response can be in the form of the requested information being received by the processor environment 112. In the case of other types of commands, the response could be a mere acknowledgement that the command (e.g., a "write") has been processed.

Once a response has been received from the digital model, the next step is to determine whether the results require further processing, as previously mentioned with regard to decision block 420. Again, this could mean processing an interrupt request or else taking some further action necessitated by the results of, for example, a read or poll command.

Figure 5:
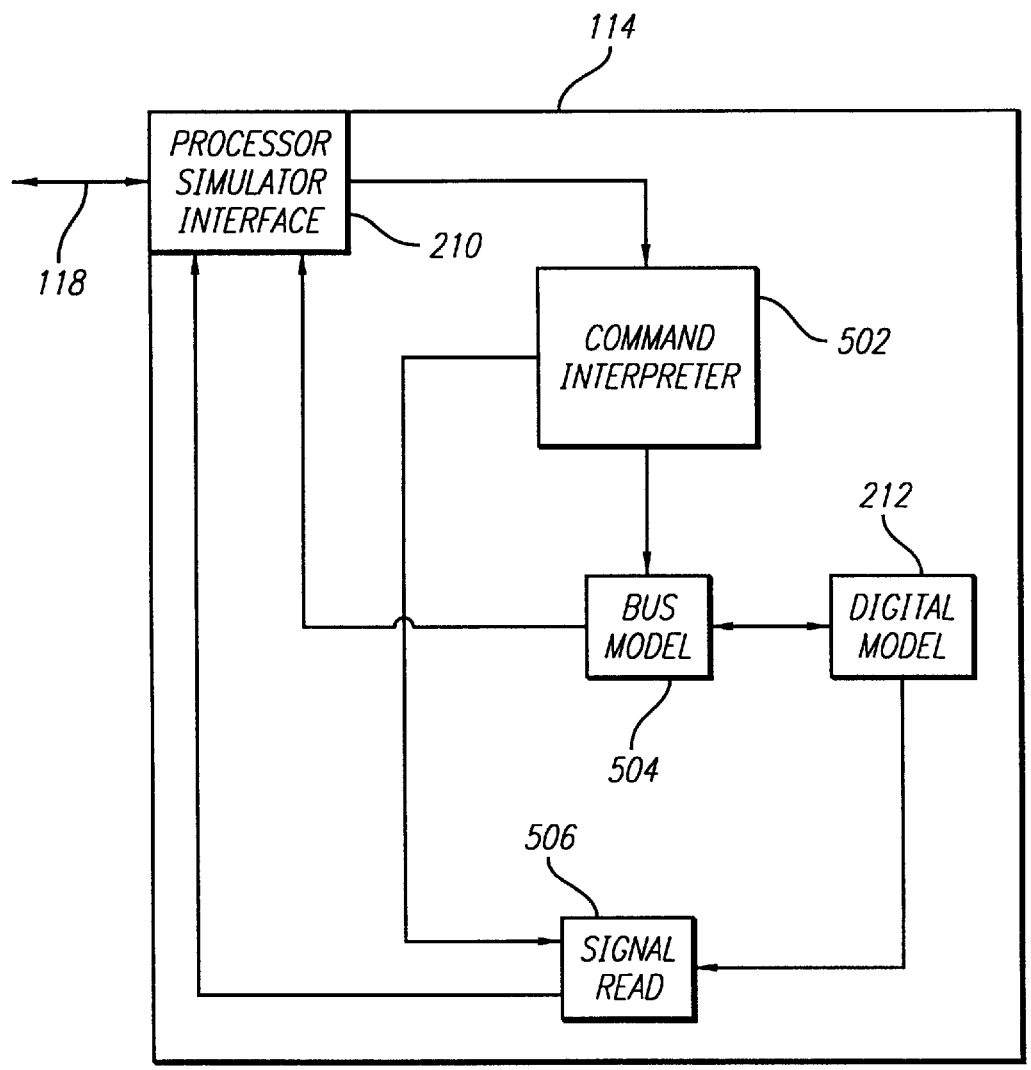
FIG. 5 is a block diagram of the digital environment as contemplated by embodiments of the present invention.

Various embodiments of the digital environment 114 and components thereof as contemplated by the present invention are now shown with regard to FIG. 5. Referring to FIG. 5, the processor simulator interface 210 receives event information as discussed above and then forwards it to a command interpreter 502. The command interpreter determines the type of command received, and acts accordingly. For example, if the command were a "poll" command, then the state of the requested signal would be obtained via a signal read module 506. For this to occur, embodiments of the present invention contemplate that the digital model 212 keeps the signal read module 506 apprised of the status of all signals within the digital model 212. More specifically, various embodiments of the present invention contemplate that the signal read module 506 becomes "active" when a signal in digital model 212 changes. All this allows for an efficient way to obtain the state of various simulated wires, etc. Once obtained, the status of the requested signal is then sent to the processor simulator interface 212 and conveyed via link 118.

If the command interpreter 502 determines that the command received is either a read or a write, the first action taken is to allow the digital model 212 to "catch-up" with the processor simulator by running through the appropriate number of bus cycles (as per the time stamp received) as discussed above. Then, bus model 504 is used to read or write the specified information. More specifically, bus model 504 activates all the necessary simulated lines of the digital model 212 (e.g., write-enable) to implement the requested action. In the case of a read command, the bus model 504 obtains the requested data and forwards it to processor simulator interface 210, which then sends it via link 118. In the case of a "write" command, after the specified data is written to the requested address, bus model 504 sends an acknowledgement to processor simulator interface 210 indicating that the write was implemented.

When a "cycle" command is received, bus model 504 runs the digital model 210 through the specified number of bus cycles (which can be any static or dynamically changing number of a user's choosing). If an event such as an interrupt request is generated, bus model 504 sends it to processor simulator interface 210 and then onto link 118. This is also the same procedure that occurs if an interrupt request is generated during a read or write command while the digital model 212 is catching up with processor environment 112 as mentioned above.

It should be understood that the implementations and examples given above concerning the components and their interactions with one another comprise possible schemes envisioned by the present invention, but that any number of different configurations are also envisioned.

Figure 6:
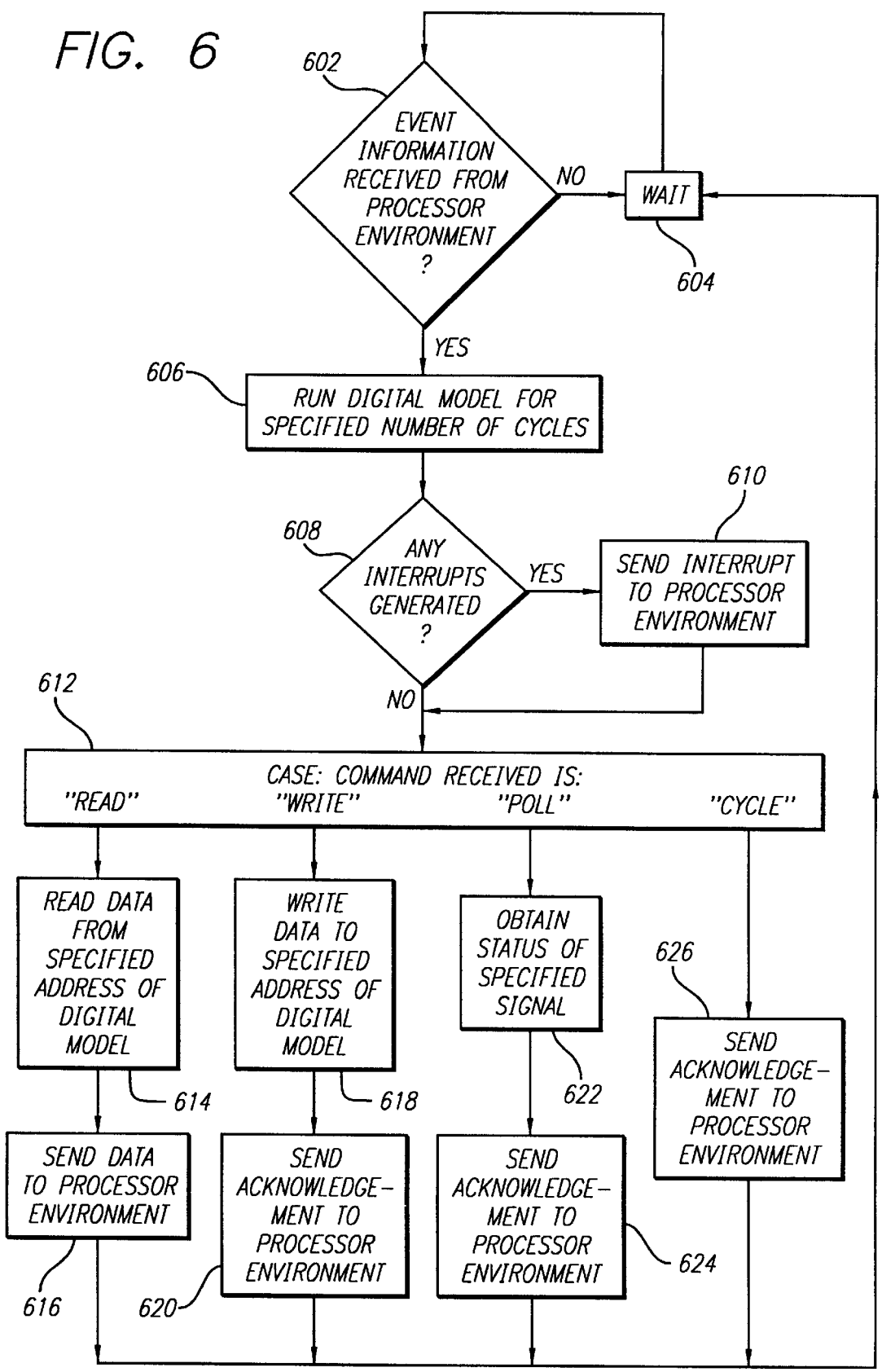
FIG. 6 is a flow diagram of a method contemplated by embodiments of the present invention concerning actions of the digital environment.

Embodiments of a method of operation of the present invention concerning the digital environment 114 are now described with regard to FIG. 6. Referring to FIG. 6, it is contemplated that no action occurs until event information is received from processor environment 112, as indicated by a decision block 602 and a block 604. Once event information is received, the next step is that the digital model 212 is run for a specified number of cycles, as either per the time stamp or the cycle command. This is indicated by a block 606. If any interrupts occur as a result of this, they are sent to processor environment 112 as indicated by a decision block 608 and a block 610. It is envisioned that the interrupt is then processed as previously discussed.

The remaining steps enacted depend upon the specific command received from the processor environment 112. As discussed above, embodiments of the present invention contemplate four possible commands can be received, as shown with regard to a block 612. Thus, for example, if the command received was a "read" command, then the next step is to read data from the specified address of the digital model 212, as indicated by a block 614. This data is then transferred to the processor environment 112, as indicated by a block 616. Once this occurs, embodiments of the present invention contemplate that the digital environment 114 will again wait for more event information to be received, as indicated by block 604 and decision block 602.

If the command received is a "write" command, then the data received from the processor environment 112 is written to the address of the digital model 212 that was specified in the event data, as indicated by a block 618. An acknowledgement is subsequently sent to the processor environment 112 indicating that the write took place. The digital environment 114 then waits for event information to again be received.

If the command is a "poll" command, the status of the specified signal is accessed as indicated by a block 622. The status of the signal is then transferred to the processor environment 112 as indicated by a block 624, and, again, environment 114 waits for event information.

If the command, is a "cycle" command, then it is assumed that the cycling already occurred in conjunction with block 606. Once completed, acknowledgement is transferred to processor environment 112 as indicated by a block 626.

Embodiments of the present invention contemplate that processor environment 112 could be constructed using any number of computer languages, including C, or the SOTL language discussed in the above-referenced thesis by Kenneth Duda. Similarly, digital environment 114 could also have been constructed using any number of computer languages. However, certain languages are geared more toward the purpose described. For example, the digital environment 114 could be written in the VHDL language using Quicksim from Mentor Corporation of Oregon.

In general, it should also be emphasized that the various components of embodiments of the present invention can be implemented in hardware, software or a combination thereof. In such embodiments, the various components and steps would be implemented in hardware and/or software to perform the functions of the present invention. Any presently available or future developed computer software language and/or hardware components can be employed in such embodiments of the present invention.

It is to be appreciated and understood that the specific embodiments of the invention described hereinbefore are merely illustrative of the general principles of the invention. Various modifications may be made by those skilled in the art consistent with the principles set forth hereinbefore.

What is claimed is:

1. A machine for testing a hypothetical system containing a processor and a digital device, the machine comprising:
   a simulation environment having a processor simulator and a digital environment, said digital environment emulating one or more pieces of digital hardware, said processor simulator and said digital environment processing independently of each other; and
   a significant event identifier to identify to the processor simulator one or more events that are significant to the digital environment,
      wherein said one or more events contain associated event information;
   interface means for conveying, to the digital environment, said event information from an instruction-oriented format to a bus signal format,
      wherein the digital environment receives and processes said event information, generating an event result,
      said interface means conveying said event result to the processor simulator.

2. The machine of claim 1, wherein said event information includes a time stamp indicating an amount of simulated time since the digital environment last received previous event information,
   and wherein, upon receiving said time stamp, the digital environment executes an appropriate number of bus cycles.

3. The machine of claim 2, wherein said time stamp is forwarded to the digital environment when no event information has been conveyed to the digital environment within a predetermined amount of time.

4. The machine of claim 2, wherein an interrupt generated by the digital environment is conveyed to the process simulator, and is processed upon receipt of said event result by the process simulator.

5. The machine of claim 1, wherein said event information includes a poll command for allowing a state of a specified simulated signal of the digital environment to be obtained and conveyed, by said interface means, to the processor simulator.

6. A machine for testing a hypothetical system containing a processor and a digital device, the machine comprising:
   a simulation environment having a processor simulator and a digital environment, said digital environment emulating one or more pieces of digital hardware, said processor simulator and said digital environment processing independently of each other; and
   a significant event identifier to identify to the processor simulator one or more events that are significant to the digital environment,
      wherein said one or more events contain associated event information;
   a digital simulator interface for conveying, to the digital environment, said event information,
      wherein the digital environment receives and processes said event information, generating an event result; and
   a processor simulator interface for conveying said event result to the processor simulator,
      wherein said digital simulator and said processor simulator translate said event information from an instruction-oriented format to a bus signal format, and vice versa.

7. The machine of claim 6, wherein said one or more significant events comprise memory reads or memory writes.

8. The machine of claim 6, wherein said event information includes a time stamp indicating an amount of simulated time since the digital environment last received previous event information,
   and wherein, upon receiving said time stamp, the digital environment executes an appropriate number of bus cycles.

9. The machine of claim 8, wherein said time stamp is forwarded to the digital environment when no event information has been conveyed to the digital environment within a predetermined amount of time.

10. The machine of claim 8, wherein an interrupt generated by the digital environment is conveyed to the process simulator, and is processed upon receipt of said event result by the process simulator.

11. A machine for testing a hypothetical system containing a processor and a digital device, the machine comprising:

a simulation environment having a processor simulator and a digital environment, said digital environment emulating one or more pieces of digital hardware, said processor simulator and said digital environment processing independently of each other; and a significant event identifier to identify to the processor simulator one or more events that are significant to the digital environment,
- wherein said one or more events contain associated event information;

processor interface means for conveying, to the digital environment, said event information;

digital interface means, for receiving said event information from said processor interface means,
- wherein said event information is translated from an instruction-oriented format to a bus signal format;

digital resumption means, responsive to said digital interface means, for initiating or resuming activity on the digital environment,
- wherein the digital environment receives and processes said event information from said digital interface means, generating an event result,
- said interface means conveying said event result to the processor simulator through said digital interface means; and digital suspension means, responsive to said digital interface means, for suspending activity on the digital environment.

12. The machine of claim 11, further comprising processor suspension means, responsive to said processor interface means, for suspending activity on the processor simulator, and
- processor resumption means, responsive to said processor interface means, for resuming activity on the processor simulator.

13. The machine of claim 12, wherein said processor suspension and resumption means, and said digital suspension and resumption means utilize UNIX named pipes.

14. The machine of claim 11, wherein said event information includes a time stamp indicating an amount of simulated time since the digital environment last received previous event information,
- and wherein, upon receiving said time stamp, the digital environment executes an appropriate number of bus cycles.

15. The machine of claim 14, wherein said time stamp is forwarded to the digital environment when no event information has been conveyed to the digital environment within a predetermined amount of time.

16. The machine of claim 14, wherein an interrupt generated by the digital environment is conveyed to the process simulator, and is processed upon receipt of said event result by the process simulator.

17. A procedure for testing a hypothetical system containing a processor and a digital device, wherein the process utilizes a simulation environment having a processor simulator and a digital environment running as independent processes, comprising the steps of:

(1) identifying one or more events that are significant to the digital environment, wherein said one or more events contains associated event information;

(2) conveying, to the digital environment, said event information of said step (1);

(3) translating said event information conveyed by said step (2) from an instruction-oriented format to a bus signal format,
- wherein the digital environment receives and processes said event information, generating an event result;

(4) conveying said event result of said step (3) to the processor simulator.

18. The procedure of claim 17, wherein said event information of said step (1) includes a time stamp indicating an amount of simulated time since the digital environment last received previous event information,
- and wherein, upon receiving said time stamp, the digital environment executes an appropriate number of bus cycles.

19. The procedure of claim 18, wherein said time stamp is forwarded to the digital environment when no event information has been conveyed to the digital environment within a predetermined amount of time.

20. The procedure of claim 17, wherein said event information of said step (1) includes a poll command for allowing a state of a specified simulated signal of the digital environment to be obtained and conveyed to the processor simulator.

* * * * *